(12) United States Patent
Kim et al.

(10) Patent No.: US 9,118,032 B2
(45) Date of Patent: Aug. 25, 2015

(54) ORGANIC LIGHT EMITTING DEVICE

(71) Applicant: LG Display Co., Ltd., Seoul (KR)

(72) Inventors: Shinhan Kim, Seoul (KR);
SeungRyong Joung, Gwangmyeong-si (KR); So Yeon Ahn, Seoul (KR);
Taeshick Kim, Yongin-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/307,018

(22) Filed: Jun. 17, 2014

(65) Prior Publication Data
US 2015/0001499 A1  Jan. 1, 2015

(30) Foreign Application Priority Data
Jun. 28, 2013  (KR) .................. 10-2013-0075881

(51) Int. Cl.
*H01L 51/50* (2006.01)
*H01L 51/52* (2006.01)
*H01L 27/32* (2006.01)

(52) U.S. Cl.
CPC .......... *H01L 51/504* (2013.01); *H01L 51/5278* (2013.01); *H01L 27/322* (2013.01); *H01L 27/3209* (2013.01); *H01L 51/5096* (2013.01)

(58) Field of Classification Search
USPC ............................................. 257/40
See application file for complete search history.

(56) References Cited

U.S. PATENT DOCUMENTS

| | | | |
|---|---|---|---|
| 2004/0149984 A1* | 8/2004 | Tyan et al. | 257/40 |
| 2005/0225232 A1* | 10/2005 | Boroson et al. | 313/504 |
| 2009/0200928 A1* | 8/2009 | Hwang et al. | 313/504 |
| 2012/0146488 A1* | 6/2012 | Loebl | 313/504 |
| 2013/0112952 A1* | 5/2013 | Adamovich et al. | 257/40 |
| 2014/0097406 A1* | 4/2014 | Cheon et al. | 257/40 |
| 2015/0069357 A1* | 3/2015 | Park | 257/40 |

* cited by examiner

*Primary Examiner* — Thao P Le
(74) *Attorney, Agent, or Firm* — Dentons U.S. LLP

(57) ABSTRACT

Disclosed is an organic light emitting device that comprises first and second electrodes; first and second stacks arranged between the first electrode and the second electrode, the first and second stacks respectively emitting colors different from each other; and an intermediate layer arranged between the first stack and the second stack, wherein the intermediate layer includes a first intermediate layer arranged adjacent to the first stack to provide electrons to the first stack, and a second intermediate layer arranged adjacent to the second stack to provide holes to the second stack, and wherein the second intermediate layer includes a P-doping charge generating layer arranged on the first intermediate layer and a layer having a hole transporting characteristic and formed on the P-doping charge generating layer.

9 Claims, 4 Drawing Sheets

ORGANIC LIGHT EMITTING DEVICE

CROSS REFERENCE TO RELATED APPLICATIONS

This application claims the benefit of the Korean Patent Application No. 10-2013-0075881 filed on Jun. 28, 2013, which is hereby incorporated by reference for all purposes as if fully set forth herein.

BACKGROUND OF THE INVENTION

1. Field of the Invention

The present invention relates to an organic light emitting device. More particularly, the present invention relates to an organic light emitting device that emits white light.

2. Discussion of the Related Art

An organic light emitting device has a structure in which an organic light emitting portion is formed between a cathode and an anode, wherein electrons are injected into the cathode, and holes are injected into the anode. If the electrons generated in the cathode and the holes generated in the anode are injected into the organic light emitting portion, an exciton is generated by combination of the injected electrons and holes, and then the generated exciton is transited from the excited state to a ground state, whereby light is emitted.

Such an organic light emitting device may be applied as a back light of a liquid crystal display device or a display device itself as well as lighting. Particularly, an organic light emitting device that emits white light may be applied to a full color display device by combination with a color filter.

In a case of a full color display device obtained by combination of a color filter and a white organic light emitting device, because the organic light emitting device emitting white light may be manufactured by one deposition process for each pixel, it is advantageous in that the process may be performed without a shadow mask.

Hereinafter, an organic light emitting device emitting white light according to the related art will be described with reference to the accompanying drawing.

FIG. 1 is a brief cross-sectional view illustrating an organic light emitting device according to one embodiment of the related art.

As shown in FIG. 1, the organic light emitting device according to one embodiment of the related art includes an anode 1, a first stack 2, an intermediate layer 3, a second stack 4, and a cathode 5.

The first stack 2 is formed on the anode 1 to emit blue (B) light. Although not shown in detail, the first stack 2 includes a light emitting layer emitting blue (B) light, a hole transporting layer for transporting holes to the light emitting layer, and an electron transporting layer for transporting electrons to the light emitting layer.

The intermediate layer 3 is formed between the first stack 2 and the second stack 4 and serves to uniformly control charges between the first stack 2 and the second stack 4. This intermediate layer 3 includes an N type charge generating layer 3a providing electrons to the first stack 2 and a P type charge generating layer 3b providing holes to the second stack 4.

The N type charge generating layer 3a is made of an organic material doped with Li having electron injection or electron transporting characteristic, and the P type charge generating layer 3b is made of an organic material having hole injection characteristic or hole transporting characteristic.

The second stack 4 is formed on the intermediate layer 3 to emit yellow green (YG) light. Similar to the first stack 2, the second stack 4 includes a light emitting layer for emitting yellow green (YG) light, a hole transporting layer for transporting holes to the light emitting layer, and an electron transporting layer for transporting electrons to the light emitting layer.

The aforementioned organic light emitting device according to one embodiment of the related art emits white light by mixing blue light emitted from the first stack 2 with yellow green light emitted from the second stack 4.

However, in the aforementioned organic light emitting device according to the embodiments of the related art, because the N type charge generating layer 3a and the P type charge generating layer 3b, which constitute the intermediate layer 3, are formed by a separate deposition process and the hole transporting layer constituting the second stack 4 on the intermediate layer 3 is also formed by a separate deposition process, a problem occurs in that the number of depositions and the number of processes are increased, whereby a driving voltage is increased.

SUMMARY OF THE INVENTION

Accordingly, the present invention is directed to an organic light emitting device that substantially obviates one or more problems due to limitations and disadvantages of the related art.

An advantage of the present invention is to provide an organic light emitting device in which driving voltage is lowered by reducing the number of depositions and the number of processes.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, an organic light emitting device comprises first and second electrodes; first and second stacks formed between the first electrode and the second electrode, the first and second stacks respectively emitting colors different from each other; and an intermediate layer arranged between the first stack and the second stack, wherein the intermediate layer includes a first intermediate layer arranged adjacent to the first stack to provide electrons to the first stack, and a second intermediate layer arranged adjacent to the second stack to provide holes to the second stack, and wherein the second intermediate layer includes a P-doping charge generating layer formed on the first intermediate layer and a layer having a hole transporting characteristic and formed on the P-doping charge generating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Reference will now be made in detail to the exemplary embodiments of the present invention, examples of which are illustrated in the accompanying drawings. Wherever possible, the same reference numbers will be used throughout the drawings to refer to the same or like parts.

The terminology "on" disclosed in this specification means that an element is formed directly on another element and moreover a third element is interposed between these elements.

The terminologies such as "first" and "second" disclosed in this specification do not mean the order of corresponding elements and are intended to identify the corresponding elements from each other.

Hereinafter, the preferred embodiments of the present invention will be described with reference to the accompanying drawings.

Figure 2:
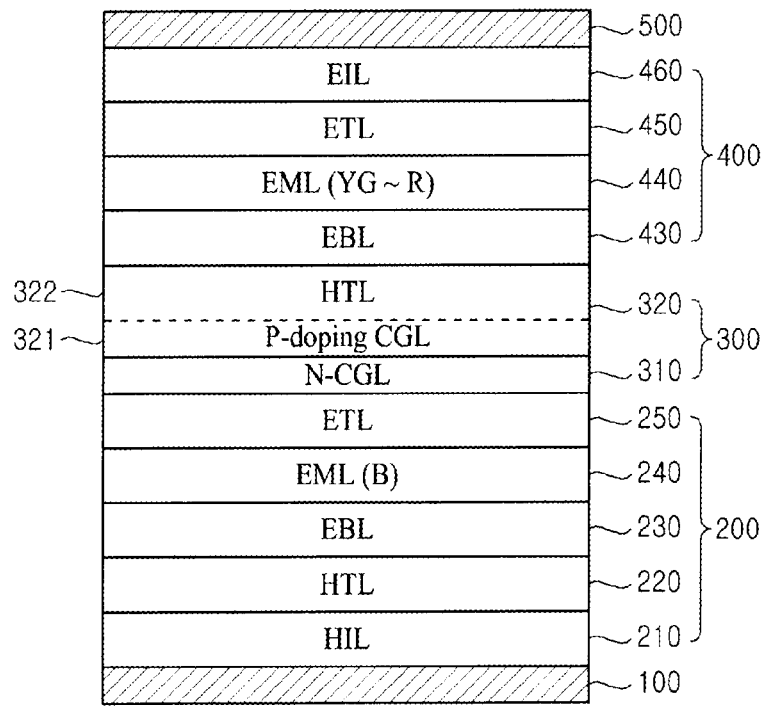
FIG. 2 is a brief cross-sectional view illustrating an organic light emitting device according to one embodiment of the present invention.

FIG. 2 is a cross-sectional view illustrating an organic light emitting device according to one embodiment of the present invention.

As shown in FIG. 2, the organic light emitting device according to one embodiment of the present invention includes a first electrode 100, a first stack 200, an intermediate layer 300, a second stack 400, and a second electrode 500.

The first electrode 100 may serve as an anode. The first electrode 100 may be made of, but not limited to, a transparent conductive material having high conductivity and high work function, for example, Indium Tin Oxide (ITO), Indium Zinc Oxide (IZO), SnO2 or ZnO.

The first stack 200 is formed on the first electrode 100 to emit light of a first color, especially blue (B) light, which has a short wavelength. The blue (B) light may have a peak wavelength in the range of 445 nm to 475 nm.

The first stack 200 may include a hole injecting layer (HIL) 210, a first hole transporting layer (HTL) 220, a first electron blocking layer (EBL) 230, a first light emitting layer (EML) 240, and a first electron transporting layer (ETL) 250, which are sequentially formed on the first electrode 100.

The hole injecting layer (HIL) 210 may be made of, but not limited to, MTDATA(4,4',4"-tris(3-methylphenylphenylamino)triphenylamine), CuPc(copper phthalocyanine) or PEDOT/PSS(poly(3,4-ethylenedioxythiphene, polystyrene sulfonate)).

The first hole transporting layer (HTL) 220 may be made of, but not limited to, TPD(N,N'-diphenyl-N,N'-bis(3-methylphenyl)-1,1'-bi-phenyl-4,4'-diamine) or NPB(N,N'-di(naphthalen-1-yl)-N,N'-diphenyl-benzidine).

The first electron blocking layer (EBL) 230 blocks movement of electrons to the first hole transporting layer (HTL) 220 to maximize combination of electrons and holes in the first light emitting layer (EML) 240. Also, the first electron blocking layer (EBL) 230 has hole transporting capability, and thus the first electron blocking layer (EBL) 230 may transport holes transported by the first hole transporting layer (HTL) 220 to the first light emitting layer (EML) 240. The first electron blocking layer (EBL) 230 may be made of, but not limited to, TCTA(4,4',4"-tris(N-carbazolyl)-triphenylamine) or carbazole-based derivative.

The first light emitting layer (EML) 240 emits blue (B) light, and may be formed by doping a host material with a blue (B) dopant. The first light emitting layer (EML) 240 may be made of, but not limited to, at least one fluorescent host material doped with a fluorescent blue (B) dopant, wherein the at least one fluorescent host material is selected from a group of an anthracene derivative, a pyrene derivative and a perylene derivative.

The first electron transporting layer (ETL) 250 may be made of, but not limited to, oxadiazole, triazole, phenanthroline, benzoxazole or benzthiazole.

The intermediate layer 300 is formed between the first stack 200 and the second stack 400. The intermediate layer 300 includes a charge generating layer (CGL) to uniformly control charges between the first stack 200 and the second stack 400. Also, the intermediate layer 300 includes a hole transporting layer (HTL) to transport holes to the second stack 400.

In more detail, the intermediate layer 300 includes a first intermediate layer 310 and a second intermediate layer 320. The first intermediate layer 310 is disposed to be adjacent to the first stack 200 while the second intermediate layer 320 is disposed to be adjacent to the second stack 400.

The first intermediate layer 310 includes an N type charge generating layer (N-CGL) to provide electrons to the first stack 200. The first intermediate layer 310 may be made of an organic layer doped with alkali metal such as Li, Na, K or Cs, or alkali earth metal such as Mg, Sr, Ba or Ra. The organic layer constituting the first intermediate layer 310 may include an organic material constituting the first electron transporting layer (ETL) 250.

The second intermediate layer 320 includes a P-doping charge generating layer (P-doping CGL) 321 and a second hole transporting layer (HTL) 322, which are sequentially formed on the first intermediate layer 310.

The P-doping charge generating layer 321 may serve to provide holes to the second stack 400, and is formed by doping a host material made of an organic material constituting the second hole transporting layer (HTL) 322 with a dopant. In other words, the second intermediate layer 320 is obtained in such a manner that the P-doping charge generating layer 321 is formed by co-deposition of the organic material constituting the second hole transporting layer (HTL) 322 and the dopant, and then the second hole transporting layer (HTL) 322 is formed by deposition of the organic material only without the dopant.

Accordingly, because the P-doping charge generating layer (P-doping CGL) 321 and the second hole transporting layer (HTL) 322 may be formed by a deposition process of one time in one deposition equipment, the process may be simplified and the number of depositions may be reduced, whereby a driving voltage may be lowered. Also, according to one embodiment of the present invention, since the P-doping charge generating layer (P-doping CGL) 321 and the second hole transporting layer (HTL) 322 are formed of the same organic material, interface characteristic between the P-doping charge generating layer (P-doping CGL) 321 and the second hole transporting layer (HTL) 322 is improved. Also, according to one embodiment of the present invention, the P-doping charge generating layer 321 is formed by doping the organic material with a dopant, whereby mobility of carriers and electrical stability of the charge generating layer are improved and the driving voltage is reduced.

The P-doping charge generating layer 321 may be formed at a thickness of 10 Å to 100 Å.

The dopant is included in the P-doping charge generating layer 321 in the range of 1% to 20% by weight for the entire P-doping charge generating layer 321, and may be made of at least one or more dopant materials selected from a group of metal oxide such as $MoO_3$, $V_2O_5$, ITO, $TiO_2$, $WO_3$ and $SnO_2$, tetrafluoro-tetracyano-quino-dimethane (F4-TCNQ), hexanitrilhexxatriphenylene, $FeCl_3$, $FeF_3$ and $SbCl^5$.

The organic material included in the P-doping charge generating layer 321 and the second hole transporting layer (HTL) 322 may be made of, but not limited to, TPD(N,N'-diphenyl-N,N'-bis(3-methylphenyl)-1,1'-bi-phenyl-4,4'-diamine) or NPB(N,N'-di(naphthalen-1-yl)-N,N'-diphenyl-benzidine).

The second stack 400 is formed on the intermediate layer 300 and emits light of a second color, for example, yellow green (YG) to red (R) light, which corresponds to a longer wavelength than that of the first color of the first stack 200. The yellow green (YG) to red (R) light may have a peak wavelength in the range of 552 nm to 625 nm.

The second stack 400 may include a second electron blocking layer (EBL) 430, a second light emitting layer (EML) 440, a second electron transporting layer (ETL) 450 and an electron injecting layer (EIL) 460, which are sequentially formed on the intermediate layer 300.

The second electron blocking layer (EBL) 430 may be formed to be in contact with an upper surface of the second hole transporting layer (HTL) 322 of the second intermediate layer 320, and may be made of the same material as that of the first electron blocking layer (EBL) 230.

The second light emitting layer (EML) 440 emits yellow green (YG) to red (R) light, and may be formed by doping a host material with a yellow green (YG) to red (R) dopant. The second light emitting layer (EML) 440 may be made of a phosphor host material doped with a yellow green (YG) to red (R) dopant, wherein the phosphor host material includes a carbazole-based compound or a metal complex. The carbazole-based compound may include CBP(4,4-N,N-dicarbazole-biphenyl), CBP derivative, mCP(N,N'-dicarbazolyl-3,5-benzene) or mCP derivative, and the metal complex may include ZnPBO(phenyloxazole) metal complex or ZnPBT (phenylthiazole) metal complex.

The second electron transporting layer (ETL) 450 may be made of, but not limited to, the same material as that of the first electron transporting layer (ETL) 250.

The electron injecting layer (EIL) 460 may be made of, but not limited to, LIF or LiQ (lithium quinolate).

The second electrode 500 may serve as a cathode. The second electrode 500 may be made of, but not limited to, a metal having low work function, for example, Al, Ag, Mg, Li, or Ca.

Figure 3:
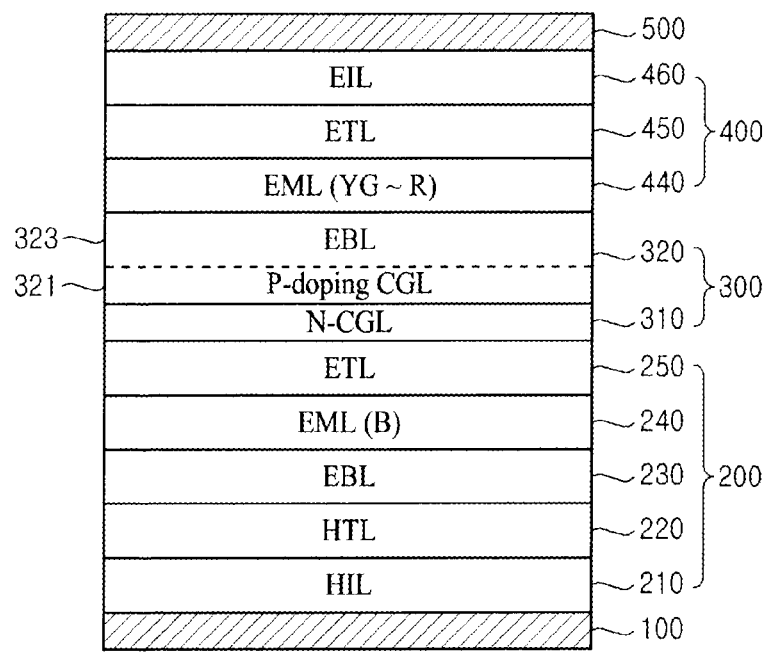
FIG. 3 is a brief cross-sectional view illustrating an organic light emitting device according to another embodiment of the present invention.

FIG. 3 is a cross-sectional view illustrating an organic light emitting device according to another embodiment of the present invention.

As shown in FIG. 3, the organic light emitting device according to another embodiment of the present invention includes a first electrode 100, a first stack 200, an intermediate layer 300, a second stack 400, and a second electrode 500.

The first electrode 100 may be an anode, and may be made of a transparent conductive material. The second electrode 500 may be a cathode, and may be made of Al, Ag, Mg, Li, or Ca.

The first stack 200 is formed on the first electrode 100 to emit light of a first color, for example, blue (B) light, which has a short wavelength. The first stack 200 may include a hole injecting layer (HIL) 210, a first hole transporting layer (HTL) 220, a first electron blocking layer (EBL) 230, a first light emitting layer (EML) 240, and a first electron transporting layer (ETL) 250, which are sequentially formed on the first electrode 100. Since each layer constituting the first stack 200 is the same as that according to the embodiment of FIG. 2, its repeated description will be omitted.

The intermediate layer 300 is formed between the first stack 200 and the second stack 400. The intermediate layer 300 includes a charge generating layer (CGL) that uniformly controls charges between the first stack 200 and the second stack 400. The intermediate layer 300 includes an electron blocking layer (EBL) to capture electrons in the second stack 400, whereby generation of exciton may be improved.

In more detail, the intermediate layer 300 includes a first intermediate layer 310 and a second intermediate layer 320. The first intermediate layer 310 is disposed to be adjacent to the first stack 200, while the second intermediate layer 320 is disposed to be adjacent to the second stack 400.

The first intermediate layer 310 includes an N type charge generating layer (N-CGL) to provide electrons to the first stack 200 in the same manner as the aforementioned embodiment of FIG. 2. The first intermediate layer 310 may be made of an organic layer doped with alkali metal or alkali earth metal in the same manner as the aforementioned embodiment of FIG. 2.

The second intermediate layer 320 includes a P-doping charge generating layer (P-doping CGL) 321 and a second electron blocking layer (EBL) 323, which are sequentially formed on the first intermediate layer 310.

The P-doping charge generating layer 321 provides holes to the second stack 400, and is formed by doping a host material made of an organic material constituting the second electron blocking layer (EBL) 323 with a dopant.

In other words, the second intermediate layer 320 is obtained in such a manner that the P-doping charge generating layer 321 is formed by co-deposition of the organic material constituting the second electron blocking layer (EBL) 323 and the dopant, and then the second electron blocking layer (EBL) 323 is formed by deposition of the organic material only without the dopant.

According to this embodiment of the present invention, because the P-doping charge generating layer (P-doping CGL) 321 and the second electron blocking layer (EBL) 323 may be formed by a deposition process of one time, the process may be simplified and the number of depositions may be reduced, whereby the driving voltage may be lowered. Also, since the P-doping charge generating layer (P-doping CGL) 321 and the second electron blocking layer (EBL) 323 are formed of the same organic material, an interface characteristic between the P-doping charge generating layer (P-doping CGL) 321 and the second electron blocking layer (EBL) 323 is improved. Also, the P-doping charge generating layer 321 is formed by doping the organic material with a dopant, whereby mobility of carriers and electrical stability of the charge generating layer are improved and the driving voltage is reduced.

It is preferable that the organic material constituting the second electron blocking layer (EBL) 323 has a hole transporting characteristic to transfer holes generated in the P-doping charge generating layer 321 to the second stack 400. Accordingly, for electron blocking and hole transporting characteristics, it is preferable that the organic material constituting the P-doping charge generating layer (P-doping CGL) 321 and the second electron blocking layer (EBL) 323 has a triplet energy of 2.8 eV or more, hole transporting capability of $1.0 \times 10^{-4}$ cm$^2$/V·s or more, and a Lumo (Lowest Unoccupied Molecular Orbital) level of −2.3 eV or more.

Also, it is preferable that the difference between a Homo (Highest Occupied Molecular Orbital) level of the organic material constituting the P-doping charge generating layer (P-doping CGL) 321 and the second electron blocking layer (EBL) 323 and a Lumo (Lowest Unoccupied Molecular Orbital) level of the dopant constituting the P-doping charge generating layer (P-doping CGL) 321 is 0.3 eV or less.

The P-doping charge generating layer 321 may be formed at a thickness of 10 Å to 100 Å.

The dopant is included in the P-doping charge generating layer 321 in the range of 1% to 20% by weight for the entire P-doping charge generating layer 321, and may be made of at least one or more dopant materials selected from a group of metal oxide, such as $MoO_3$, $V_2O_5$, ITO, $TiO_2$, $WO_3$ and $SnO_2$, tetrafluoro-tetracyano-quino-dimethane (F4-TCNQ), hexanitrilhexxatriphenylene, $FeCl_3$, $FeF_3$ and $SbCl_5$.

Also, the organic material included in the P-doping charge generating layer 321 and the second electron blocking layer 323 may be made of TCTA(4,4',4"-tris(N-carbazolyl)-triphenylamine), or carbazole-based derivative.

The second stack 400 is formed on the intermediate layer 300 and emits light of a second color, for example, yellow green (YG) to red (R) light, which corresponds to a longer wavelength than that of the first color.

The second stack 400 may include a second light emitting layer (EML) 440, a second electron transporting layer (ETL) 450 and an electron injecting layer (EIL) 460, which are sequentially formed on the intermediate layer 300.

The second light emitting layer (EML) 440 may be formed to be in contact with an upper surface of the second electron blocking layer (EBL) 323 of the second intermediate layer 320. The second light emitting layer (EML) 440 emits yellow green (YG) to red (R) light, and may be formed by doping a phosphor host material of a carbazole-based compound or a metal complex with a yellow green (YG) to red (R) dopant in the same manner as the aforementioned embodiment of FIG. 2.

The second electron transporting layer (ETL) 450 may be made of, but not limited to, the same material as that of the first electron transporting layer (ETL) 250.

The electron injecting layer (EIL) 460 may be made of, but not limited to, LIF or LiQ (lithium quinolate).

Figure 4:
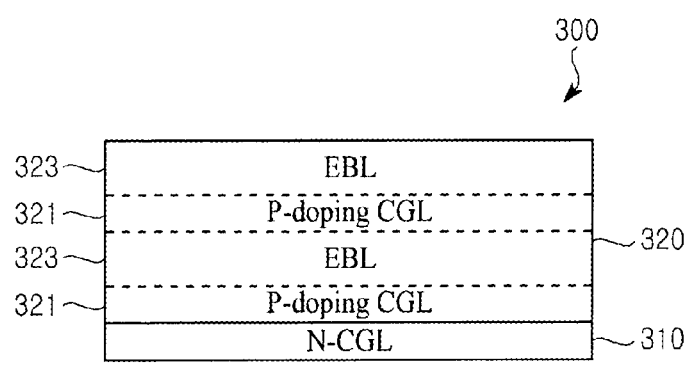
FIG. 4 is a brief cross-sectional view illustrating an organic light emitting device according to still another embodiment of the present invention.

FIG. 4 is a cross-sectional view illustrating an organic light emitting device according to another embodiment of the present invention, and illustrates an intermediate layer 300 only for convenience. In other words, the intermediate layer 300 of the organic light emitting device according to FIG. 3 may be changed to the intermediate layer 300 shown in FIG. 4.

As shown in FIG. 4, the intermediate layer 300 according to another embodiment of the present invention includes a charge generating layer (CGL) and an electron blocking layer (EBL).

In more detail, the intermediate layer 300 includes a first intermediate layer 310 disposed to be adjacent to the first stack 200 and a second intermediate layer 320 disposed to be adjacent to the second stack 400.

The first intermediate layer 310 includes an N type charge generating layer (N-CGL) in the same manner as the aforementioned embodiment of FIG. 3.

The second intermediate layer 320 has a structure in which the P-doping charge generating layer (P-doping CGL) 321 and the second electron blocking layer (EBL) 323 are alternately formed on the first intermediate layer 310.

The P-doping charge generating layer 321 is formed by doping a host material made of an organic material constituting the second electron blocking layer (EBL) 323 with a dopant. Accordingly, the second intermediate layer 320 may be obtained in such a manner that the P-doping charge generating layer 321 is formed by co-deposition of the organic material constituting the second electron blocking layer (EBL) 323 and the dopant, and then the second electron blocking layer (EBL) 323 is formed by deposition of the organic material only without the dopant. In other words, the second intermediate layer 320 of FIG. 4 may be obtained by repeating the process of doping an organic material constituting the second electron blocking layer (EBL) 323 with the dopant for a certain time and the process of depositing the organic material only without the dopant for a certain time.

Although the P-doping charge generating layer 321 is formed twice in FIG. 4, the P-doping charge generating layer 321 may be formed three times. However, if the P-doping charge generating layer 321 is formed four times or more, the second intermediate layer 320 may be conducted due to reverse current. Accordingly, it is preferable that the P-doping charge generating layer 321 is formed three times or less.

In the same manner as FIG. 3, it is preferable that the organic material constituting the P-doping charge generating layer 321 and the second electron blocking layer 323 has hole transporting characteristic. Accordingly, it is preferable that the organic material constituting the P-doping charge generating layer 321 and the second electron blocking layer 323 has a triplet energy of 2.8 eV or more, hole transporting capability of $1.0 \times 10^{-4}$ cm$^2$/V·s or more, and a Lumo (Lowest Unoccupied Molecular Orbital) level of −2.3 eV or more. Also, it is preferable that the difference between a Homo (Highest Occupied Molecular Orbital) level of the organic material constituting the P-doping charge generating layer (P-doping CGL) 321 and the second electron blocking layer (EBL) 323 and a Lumo (Lowest Unoccupied Molecular Orbital) level of the dopant constituting the P-doping charge generating layer (P-doping CGL) 321 is 0.3 eV or less.

The P-doping charge generating layer 321 may be formed at a thickness of 10 Å to 100 Å. Also, the second intermediate layer 320 may be formed at a thickness of 10 nm to 150 nm. If the second intermediate layer 320 is formed at a thickness less than 10 nm, it is difficult to form the P-doping charge generating layer 321. If the second intermediate layer 320 is formed at a thickness exceeding 150 nm, the driving voltage may be increased.

Also, the dopant included in the P-doping charge generating layer 321 is the same as that in the aforementioned embodiment of FIG. 3, and the organic material included in the P-doping charge generating layer 321 and the second electron blocking layer 323 is the same as that in the aforementioned embodiment of FIG. 3.

If the second intermediate layer 320 is formed in such a manner that the P-doping charge generating layer (P-doping CGL) 321 and the second electron blocking layer (EBL) 323 are alternately formed as described with reference to FIG. 4, resistance may easily be controlled in the entire second intermediate layer 320, and carrier injection into the second light emitting layer (EML) 440 may easily be performed, whereby charge balance may easily be controlled.

Figure 5:
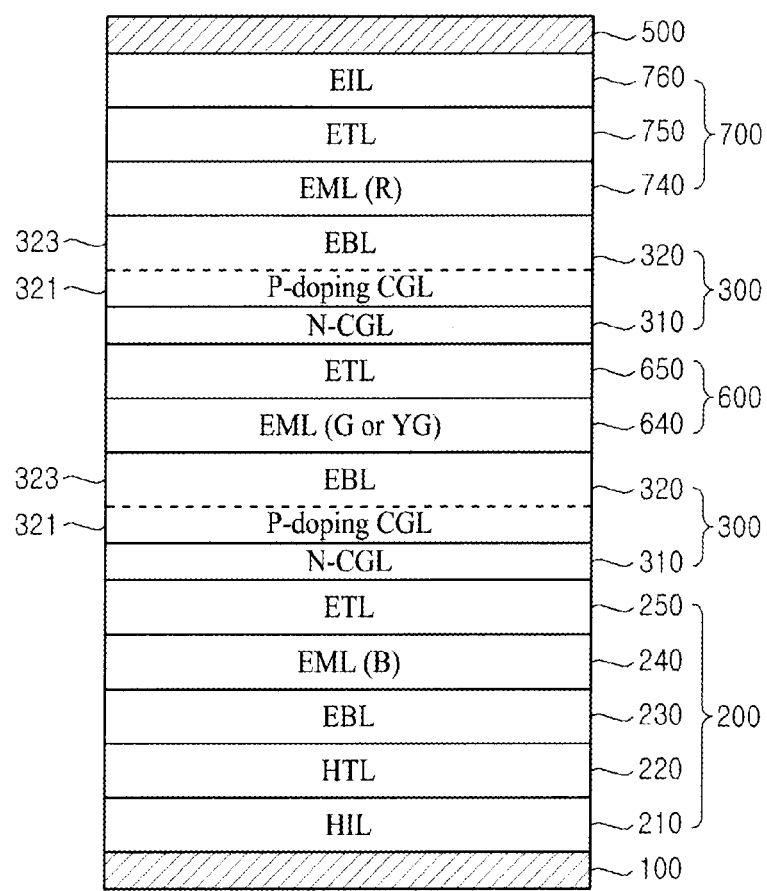
FIG. 5 is a brief cross-sectional view illustrating an organic light emitting device according to further still another embodiment of the present invention.

FIG. 5 is a cross-sectional view illustrating an organic light emitting device according to another embodiment of the present invention, and more specifically relates to an organic light emitting device emitting white light through a combination of three stacks that respectively emit colors different from another.

As shown in FIG. 5, the organic light emitting device according to another embodiment of the present invention includes a first electrode 100, a first stack 200, an intermediate layer 300, a second stack 600, a third stack 700 and a second electrode 500.

The first electrode 100 may be an anode, and may be made of a transparent conductive material. The second electrode 500 may be a cathode, and may be made of Al, Ag, Mg, Li, or Ca.

The first stack 200 is formed on the first electrode 100 to emit light of a first color, for example blue (B) light, which has a short wavelength. The blue (B) light may have a peak wavelength in the range of 445 nm to 475 nm.

The first stack 200 may include a hole injecting layer (HIL) 210, a first hole transporting layer (HTL) 220, a first electron blocking layer (EBL) 230, a first light emitting layer (EML) 240, and a first electron transporting layer (ETL) 250, which are sequentially formed on the first electrode 100. Since each layer constituting the first stack 200 is the same as that according to the embodiment of FIG. 3, its repeated description will be omitted.

The intermediate layer 300 is formed between the first stack 200 and the second stack 600 and between the second stack 600 and the third stack 700. In the same manner as the aforementioned embodiment of FIG. 3, the intermediate layer 300 includes a first intermediate layer 310 and a second intermediate layer 320 that includes a P-doping charge generating layer (P-doping CGL) 321 and a second electron blocking layer (EBL) 323. Repeated description of each layer will be omitted.

However, the intermediate layer 300 may be provided in the same manner as that in the second embodiment or the fourth embodiment. Also, the intermediate layer 300 formed between the first stack 200 and the second stack 600 may be the same as or different from the intermediate layer 300 formed between the second stack 600 and the third stack 700.

The second stack 600 is formed on the intermediate layer 300 and emits light of a second color, for example green (G) or yellow green (YG) light, which corresponds to an intermediate wavelength. The green (G) light may have a peak wavelength in the range of 510 nm to 545 nm, and the yellow green (YG) light may have a peak wavelength in the range of 552 nm to 575 nm.

The second stack 400 may include a second light emitting layer (EML) 640 and a second electron transporting layer (ETL) 650, which are sequentially formed on the intermediate layer 300.

The second light emitting layer (EML) 640 emits green (G) or yellow green (YG) light, and may be formed by doping a host material with a green (G) or yellow green (YG) dopant. The second light emitting layer (EML) 640 may be made of a phosphor host material doped with a green (G) or yellow green (YG) dopant, wherein the phosphor host material includes a carbazole-based compound or a metal complex. The carbazole-based compound may include CBP(4,4-N,N'-dicarbazole-biphenyl), CBP derivative, mCP(N,N'-dicarbazolyl-3,5-benzene) or mCP derivative, and the metal complex may include ZnPBO(phenyloxazole) metal complex or ZnPBT(phenylthiazole) metal complex.

The second electron transporting layer (ETL) 650 may be made of oxadiazole, triazole, phenanthroline, benzoxazole, or benzthiazole.

The third stack 700 is formed on the intermediate layer 300 and emits light of a third color, for example red (R) light, which corresponds to a long wavelength. The red (R) light may have a peak wavelength in the range of 600 nm to 625 nm.

The third stack 700 may include a third light emitting layer (EML) 740, a third electron transporting layer (ETL) 750, and an electron injecting layer (EIL) 760, which are sequentially formed on the intermediate layer 300.

The third light emitting layer (EML) 740 emits red (R) light, and may be formed by doping a host material with a red (R) dopant. The host material used for the third light emitting layer (EML) 740 may be a phosphor host material of a carbazole-based compound or a metal complex. The red dopant may be made of, but not limited to, metal complex of Ir or Pt.

The third electron transporting layer (ETL) 750 may be made of oxadiazole, triazole, phenanthroline, benzoxazole, or benzthiazole.

The electron injecting layer (EIL) 760 may be made of, but not limited to, LIF or LiQ (lithium quinolate).

The following Table 1 illustrates a driving voltage V, light emitting efficiency (cd/A, cd/m$^2$), brightness (lm/W) and energy conversion quantum efficiency (EQE) of the organic light emitting device that includes a first stack emitting blue (B) light, a second stack emitting green (G) light, a third stack emitting red (R) light, and intermediate layers respectively formed between the first stack and the second stack and between the second stack and the third stack.

Figure 1:
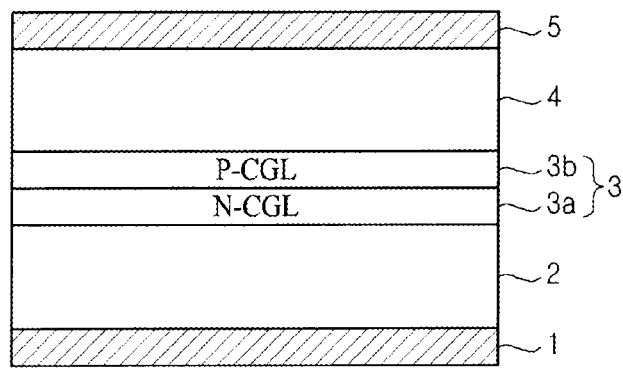
FIG. 1 is a brief cross-sectional view illustrating an organic light emitting device according to an embodiment of the related art.

In Table 1, a comparison example illustrates application of the intermediate layer 300 of FIG. 1, Embodiment 1 illustrates application of the intermediate layer 300 of FIG. 2, and Embodiment 2 illustrates application of the intermediate layer 300 of FIG. 3.

TABLE 1

|  | Volt(V) | cd/A | cd/m$^2$ | lm/W | EQE |
| --- | --- | --- | --- | --- | --- |
| Comparison Example | 11.9 | 103.7 | 10370 | 27.5 | 45.1 |
| Embodiment 1 | 10.6 | 105.8 | 10580 | 31.3 | 47.1 |
| Embodiment 2 | 11.3 | 110.8 | 11080 | 30.8 | 49.2 |

As presented in Table 1 above, the driving voltage in Embodiment 1 and Embodiment 2 is lower than that in the Comparison example, and light emitting efficiency, brightness and energy conversion quantum efficiency in Embodiment 1 and Embodiment 2 are better than those in the Comparison example.

Figure 6:
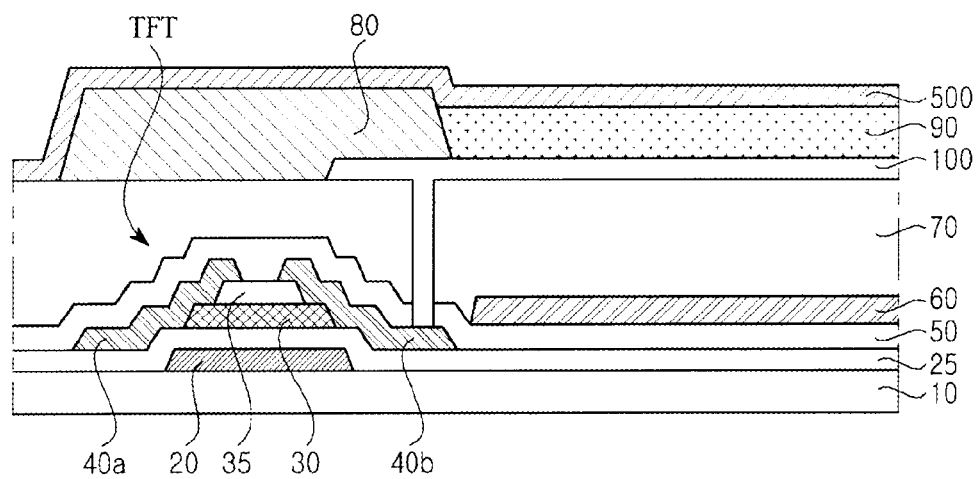
FIG. 6 is a brief cross-sectional view illustrating a display device according to one embodiment of the present invention.

FIG. 6 is a cross-sectional view illustrating a display device according to an embodiment of the present invention, and more specifically relates to a full color display device provided by combination of the organic light emitting device according to the aforementioned embodiments and a color filter.

As shown in FIG. 6, in the display device according to an embodiment of the present invention, a thin film transistor (TFT) is formed on a substrate 10, and the organic light emitting device is electrically connected with the thin film transistor (TFT).

In more detail, the display device according to one embodiment of the present invention includes a substrate 10, a gate electrode 20, a gate insulating film 25, an active layer 30, an etch stopper 35, a source electrode 40a, a drain electrode 40b, a passivation film 50, a color filter 60, a planarization layer 70, a bank layer 80, and an organic light emitting device.

The gate electrode 20 is patterned on the substrate 10, and the gate insulating film 25 is formed on an entire surface of the substrate including the gate electrode 20. The gate electrode 20 may be made of metal such as Mo, Al, Cr, Au, Ti, Ni, Nd or Cu, and the gate insulating film 25 may be made of an inorganic insulating material such as silicon oxide or silicon nitride.

The active layer 30 is patterned on the gate insulating film 25, and the etch stopper 35 is patterned on the active layer 30, whereby a channel region of the active layer 30 is prevented from being etched during an etching process for patterning the source electrode 40a and the drain electrode 40b. The active layer 30 may be made of a silicon based semiconductor, or an oxide semiconductor such as ITZO, IZO, ZnO, or In—Ga—Zn—O(IGZO).

The source electrode 40a and the drain electrode 40b are patterned on the etch stopper 30 while facing each other. The source electrode 40a and the drain electrode 40b may be made of metal such as Mo, Al, Cr, Au, Ti, Ni, Nd or Cu.

The passivation film 50 is formed on the source electrode 40a and the drain electrode 40b, and the color filter 60 is patterned on the passivation film 50. The passivation film 50 may be made of an inorganic insulating material such as silicon oxide or silicon nitride. The color filter 60 is formed to overlap a light emitting portion 90 of the organic light emitting device, whereby light emitted from the light emitting portion 90 may be emitted towards the substrate 10 through the color filter 60. This color filter 60 may include a red color filter, a green color filter and a blue color filter, which are formed to be identified from one another for each pixel.

The planarization layer 70 is formed on the color filter 60. The planarization layer 70 may be made of an organic insulating material such as photo acryl or BCB.

The bank layer 80 is formed on the planarization layer 70. In more detail, the bank layer 80 is patterned to overlap the thin film transistor (TFT), and a light emitting region is defined by the bank layer 80. The bank layer 80 may be made of an organic insulating material, for example, polyimide, photo acryl, or BCB.

The organic light emitting device includes a first electrode 100, a light emitting portion 90, and a second electrode 500. As disclosed in FIGS. 2 to 5, the first electrode 100 may be an anode, and the second electrode 500 may be a cathode. Also, various modifications may be made in the light emitting portion 90, which is formed between the first electrode 100 and the second electrode 500, as shown in FIGS. 2 to 5, and the repeated description of the light emitting portion 90 will be omitted.

Although the display device to which the organic light emitting device according to the present invention is applied has been described as above, the organic light emitting device according to the present invention may be applied to display devices of various structures. Also, the organic light emitting device according to the present invention may be applied to various devices known in the art, for example, lighting equipment, without being limited to the display device only.

According to the present invention described above, the following advantages may be obtained.

Because the P-doping charge generating layer (P-doping CGL) may be formed by a one-time deposition process together with the layer having a hole transporting characteristic, such as the hole transporting layer (HTL) or the electron blocking layer, the overall process may be simplified, and the number of depositions is reduced, whereby the driving voltage may be lowered.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting device comprising:
   first and second electrodes;
   first and second stacks arranged between the first electrode and the second electrode, the first and second stacks respectively emitting colors different from each other; and
   an intermediate layer arranged between the first stack and the second stack,
   wherein the intermediate layer includes a first intermediate layer arranged adjacent to the first stack to provide electrons to the first stack, and a second intermediate layer arranged adjacent to the second stack to provide holes to the second stack, and
   wherein the second intermediate layer includes a P-doping charge generating layer formed on the first intermediate layer and a layer having hole transporting characteristic formed on the P-doping charge generating layer.

2. The organic light emitting device of claim 1, wherein the P-doping charge generating layer is an organic material constituting the layer having the hole transporting characteristic doped with a dopant.

3. The organic light emitting device of claim 1, wherein the layer having the hole transporting characteristic is comprised of a hole transporting layer, and the second stack includes an electron blocking layer formed on the hole transporting layer.

4. The organic light emitting device of claim 1, wherein the layer having the hole transporting characteristic is comprised of an electron blocking layer, and the second stack includes a light emitting layer formed on the electron blocking layer.

5. The organic light emitting device of claim 4, wherein the P-doping charge generating layer and the electron blocking layer are repeated alternately.

6. The organic light emitting device of claim 5, wherein the P-doping charge generating layer is repeatedly formed three times or less.

7. The organic light emitting device of claim 1, wherein the organic material has a triplet energy of 2.8 eV or more, a hole transporting capability of $1.0 \times 10^{-4}$ cm$^2$/V·s or more and a Lumo (Lowest Unoccupied Molecular Orbital) level of $-2.3$ eV or more.

8. The organic light emitting device of claim 1, wherein a difference between a Homo (Highest Occupied Molecular Orbital) level of the organic material and a Lumo (Lowest Unoccupied Molecular Orbital) level of the dopant is 0.3 eV or less.

9. The organic light emitting device of claim 1, further comprising:
   a third stack emitting light of a color different from those of the first stack and the second stack; and
   an intermediate layer formed between the second stack and the third stack.

* * * * *